United States Patent
Kitamura et al.

(10) Patent No.: US 10,777,706 B2
(45) Date of Patent: Sep. 15, 2020

(54) ELECTROCHEMICAL REMOVAL OF ALUMINUM NITRIDE SUBSTRATES FOR ELECTRONIC AND OPTOELECTRONIC DEVICES

(71) Applicants: Ken Kitamura, Tokyo (JP); Jianfeng Chen, Ballston Lake, NY (US); Leo J. Schowalter, Latham, NY (US)

(72) Inventors: Ken Kitamura, Tokyo (JP); Jianfeng Chen, Ballston Lake, NY (US); Leo J. Schowalter, Latham, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

(21) Appl. No.: 16/161,320

(22) Filed: Oct. 16, 2018

(65) Prior Publication Data

US 2019/0115501 A1  Apr. 18, 2019

Related U.S. Application Data

(60) Provisional application No. 62/572,614, filed on Oct. 16, 2017.

(51) Int. Cl.

| H01L 33/32 | (2010.01) |
| H01L 33/58 | (2010.01) |
| H01L 33/22 | (2010.01) |
| H01L 33/40 | (2010.01) |
| H01L 33/00 | (2010.01) |

(Continued)

(52) U.S. Cl.
CPC .......... *H01L 33/32* (2013.01); *H01L 33/0075* (2013.01); *H01L 33/0093* (2020.05); *H01L 33/06* (2013.01); *H01L 33/20* (2013.01); *H01L 33/22* (2013.01); *H01L 33/40* (2013.01); *H01L 33/58* (2013.01); *H01L 2933/0016* (2013.01)

(58) Field of Classification Search
CPC ..... H01L 33/32; H01L 33/20; H01L 33/0079; H01L 33/06; H01L 33/0075; H01L 33/40; H01L 33/22; H01L 33/58; H01L 2933/0016

See application file for complete search history.

(56) References Cited

U.S. PATENT DOCUMENTS

| 5,501,787 A | 3/1996 | Bassous et al. |
| 5,602,418 A * | 2/1997 | Imai ................... H01L 31/1852 251/82 |

(Continued)

FOREIGN PATENT DOCUMENTS

JP  09-307188 A  11/1997

OTHER PUBLICATIONS

International Search Report and the Written Opinion for international application No. PCT/US2018/055997 dated Feb. 11, 2019 10 pages.

*Primary Examiner* — Kyoung Lee
*Assistant Examiner* — Christina A Sylvia
(74) *Attorney, Agent, or Firm* — Morgan, Lewis & Bockius LLP

(57) ABSTRACT

In various embodiments, an electrochemical process is utilized to remove at least a portion of a substrate from multiple singulated or unsingulated electronic-device or optoelectronic-device dies. The dies may be attached to a submount for the removal process, and the dies may be immersed in or non-immersively contact an electrolyte during the removal process.

40 Claims, 13 Drawing Sheets

(51) Int. Cl.
*H01L 33/06* (2010.01)
*H01L 33/20* (2010.01)

(56) References Cited

U.S. PATENT DOCUMENTS

| | | | |
|---|---|---|---|
| 2002/0054617 A1* | 5/2002 | Tsuda | B82Y 20/00 372/46.01 |
| 2003/0038038 A1* | 2/2003 | Basol | C25D 5/02 205/125 |
| 2005/0127382 A1 | 6/2005 | Groetsch et al. | |
| 2007/0284607 A1* | 12/2007 | Epler | H01L 33/16 257/103 |
| 2012/0298952 A1* | 11/2012 | Hikosaka | H01L 33/20 257/13 |
| 2013/0049005 A1 | 2/2013 | Chua et al. | |
| 2013/0214325 A1* | 8/2013 | Kinoshita | C30B 29/403 257/103 |
| 2015/0048381 A1* | 2/2015 | Holder | H01L 29/2003 257/76 |

* cited by examiner

ELECTROCHEMICAL REMOVAL OF ALUMINUM NITRIDE SUBSTRATES FOR ELECTRONIC AND OPTOELECTRONIC DEVICES

RELATED APPLICATIONS

This application claims the benefit of and priority to U.S. Provisional Patent Application No. 62/572,614, filed Oct. 16, 2017, the entire disclosure of which is hereby incorporated herein by reference.

TECHNICAL FIELD

In various embodiments, the present invention relates to substrate removal for electronic and optoelectronic devices fabricated on aluminum nitride substrates.

BACKGROUND

The output powers, efficiencies, and lifetimes of short-wavelength ultraviolet light-emitting diodes (UV LEDs), i.e., LEDs that emit light at wavelengths less than 350 nm, based on the nitride semiconductor system remain limited due to high defect levels in the active region. These limitations are particularly problematic (and notable) in devices designed to emit at wavelengths less than 270 nm. Most development effort has been carried out on devices formed on foreign substrates such as sapphire where defect densities remain high despite innovative defect-reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of short-wavelength UV LEDs has low wall-plug efficiencies (WPE) of, at best, only a few percent, where WPE is defined as the ratio of usable optical power (in this case, emitted UV light) achieved from the diode divided by the electrical power into the device. The WPE of an LED can be calculated by taking the product of the electrical efficiency ($\eta_{el}$), the photon extraction efficiency ($\eta_{ex}$), and the internal efficiency (IE); i.e., WPE=$\eta_{el}$× $\eta_{ex}$×IE. The IE itself is the product of current injection efficiency ($\eta_{inj}$) and the internal quantum efficiency (IQE); i.e., IE=$\eta_{inj}$×IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues can contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. Additionally, UV LEDs suffer because approximately half of the generated photons are directed toward the p-contact and absorbed by the p-GaN of that contact. Even when photons are directed toward the AlN surface, only 9.4% can escape from an untreated surface due to the large index of refraction of the AlN, which results in a small escape cone. Additional photons are lost on their way to the exit surface due to absorption in the AlN wafer. These losses are multiplicative and the average photon extraction efficiency is only about 2.5%.

Since photon absorption by the AlN substrate and the high refractive index contrast between air and AlN deleteriously impact the photon-extraction efficiency of UV LEDs on AlN, these effects may be ameliorated via removal of all or a portion of the substrate. Various techniques have been developed for removal of substrates in other materials systems, but such techniques are generally not effective when utilized for UV LEDs on AlN substrates. Moreover, encapsulation techniques utilizing rigid lenses have been utilized to enhance photon-extraction efficiency—see, e.g., U.S. Pat. No. 8,962,359, filed on Jul. 19, 2012, the entire disclosure of which is incorporated by reference herein—but such techniques generally do not directly address substrate absorption.

AlN substrates also enable the fabrication of high-power electronic devices, such as transistors (e.g., vertical power devices) capable of switching high voltages and producing high levels of electric current. However, the performance of such devices, which typically incorporate a back contact (e.g., a drain contact), may be compromised by the relatively high resistivity of the AlN substrate, which is difficult to dope at high levels. Removal of the AlN substrate would enable lower-resistivity contacts that directly improve performance of AlN-based electronic devices.

In view of the foregoing, there is a need for improved techniques for the removal of all or a portion of an AlN substrate of an electronic device (e.g., a transistor) or an optoelectronic device (e.g., a UV light-emitting device).

SUMMARY

In various embodiments of the present invention, the photon-extraction efficiency and external quantum efficiency of UV light-emitting devices such as UV LEDs are improved via removal of all or a portion of the AlN substrates on which the devices are fabricated. Similarly, in various embodiments, the performance of electronic devices fabricated on AlN substrates is improved via formation of lower resistivity contacts to more highly doped, AlN or non-AlN epitaxial layers (e.g., AlGaN layers) formed over the substrate after removal of the AlN substrate.

In various embodiments, electronic and/or optoelectronic device structures incorporating a doped contact layer are formed over undoped AlN substrates. (As utilized herein, an "undoped" layer or substrate is not intentionally doped, and/or has a resistivity of at least 100,000 ohm·cm, and/or has a dopant concentration of approximately $3\times10^{17}$ cm$^{-3}$ or less.) The undoped substrate, as well as any undoped layers thereover (e.g., one or more undoped AlN homoepitaxial layers), is subsequently removed via an electrochemical etching process that automatically stops at, and does not appreciably remove, the doped contact layer and the remaining device structure thereover. That is, the doped layer (and the remaining device structure thereover) remain "substantially unetched," i.e., retain at least 90% (or, in some embodiments, at least 95%, or even at least 99%) of its thickness, during and after contact with the etchant. (As utilized herein, a "doped" layer or substrate has a resistivity of at most 50,000 ohm·cm, or at most 30,000 ohm·cm, or at most 10,000 ohm·cm, or at most 5,000 ohm·cm, or at most 1,000 ohm·cm, and/or has a dopant concentration of approximately $1\times10^{18}$ cm$^{-3}$ or more, or approximately $1\times10^{19}$ cm$^{-3}$ or more, or approximately $1\times10^{20}$ cm$^{-3}$ or more.)

The removal of the AlN substrate eliminates photon absorption by the substrate, enabling improved optoelectronic device performance and efficiency. The removal of the AlN substrate also enables formation of low-resistivity contacts, enabling improved electronic device performance. In various embodiments, the surface of the contact layer revealed by the electrochemical etch process may be textured (e.g., roughened) and/or coated in order to further enhance photon extraction therefrom. In various embodiments, the etch process itself results in a textured surface (e.g., featuring an array of pyramidal features) that enhances photon extraction from the remaining device structure.

Techniques in accordance with various embodiments of the present invention may be combined with the use of one or more release layers embedded within the AlN substrate, as detailed in U.S. patent application Ser. No. 15/977,031, filed on May 11, 2018 (the '031 application), the entire disclosure of which is incorporated by reference herein. In various embodiments, the AlN substrate may have one or more release layers embedded therein (e.g., via epitaxial growth, diffusion, ion implantation, etc.), and subsequent application of light and/or heat to the release layer induces fracture therein, removing the underlying portion(s) of the original AlN substrate. Since such portions need not be removed electrochemically, the portions of the AlN substrate underlying the release layer may be doped. After removal of the AlN substrate portions (and optional removal of any portion of the release layer remaining on the substrate by, e.g., etching or polishing), the remaining portion of the AlN substrate, which is typically undoped, may be removed electrochemically as described herein. (Thus, references to a "substrate" herein that is electrochemically removed include both entire substrates and substrate portions, e.g., when one or more portions of the initial substrate have been previously removed via another technique such as use of a release layer.) Such embodiments may require less etching time due to the initial removal step utilizing the release layer. In various embodiments, the release layer is substantially lattice-matched to the AlN substrate (and/or to one or more portions of the overlying device structure), but it has a different absorption coefficient at one or a range of wavelengths (for fracture-facilitating absorption of light), and/or a different coefficient of thermal expansion that results in fracture-facilitating thermal expansion mismatch when heat is applied, as described in the '031 application.

For example, in various embodiments, the release layer may include, consist essentially of, or consist of AlN or AlGaN doped with one or more impurities that form an absorption band within the release layer for a wavelength of light not strongly absorbed by the substrate itself. For example, the release layer may include, consist essentially of, or consist of AlN doped with oxygen, which has an absorption band at approximately 310 nm. In various embodiments, the release layer may be doped with oxygen (O) and/or one or more other dopants, for example, carbon (C), iron (Fe), manganese (Mn), or gadolinium (Gd). In various embodiments of the invention, one or more of the dopants may be introduced into and/or present within the release layer at a concentration of at least for example, approximately $10^{17}$ cm$^{-3}$, at least approximately $10^{18}$ cm$^{-3}$, or even at least $10^{19}$ cm$^{-3}$. In various embodiments of the invention, one or more of the dopants may be introduced into and/or present within the release layer at a concentration of at most for example, approximately $10^{20}$ cm$^{-3}$, or at most approximately $10^{21}$ cm$^{-3}$.

In exemplary embodiments, a release layer including, consisting essentially, or consisting of AlN doped with oxygen may exhibit an absorption band at a wavelength of approximately 310 nm, and a release layer including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, the release layer may include, consist essentially of, or consist of a semiconductor other than AlN (e.g., AlGaN), and which may contain one or more dopants forming one or more absorption bands for light that is not strongly absorbed by substrate. In various embodiments, the release layer may include, consist essentially of, or consist of a nitride alloy containing one or more of boron, aluminum, gallium, and/or indium. The release layer may even include, consist essentially of, or consist of silicon carbide or a metal nitride (in which the metal is, e.g., one or more of Sc, Y, La, Ti, or Ta). For example, a release layer including, consisting essentially, or consisting of silicon carbide may exhibit an absorption band at a wavelength of approximately 376 nm, and a release layer including, consisting essentially, or consisting of titanium nitride may exhibit an absorption band at a wavelength of approximately 365 nm.

References made herein to AlGaN or $Al_{1-a}Ga_aN$ alloys and layers (a being any subscript that may be provided in references to AlGaN herein) are understood to optionally include indium (In) unless the alloy or layer in question is specifically described as being substantially free of In; thus, references made herein to AlGaN or $Al_{1-a}Ga_aN$ are understood to be equivalent to AlInGaN or $Al_{1-a-b}Ga_aIn_bN$ unless otherwise specified. As utilized herein, a layer or alloy being "substantially free of In" means that the layer or alloy is free of In in any but trace amounts, which may be detectable via chemical analysis but do not affect band gap or other properties of the layer or alloy by more than 1% (or, in some embodiments, by more than 0.5% or by more than 0.1%).

In an aspect, embodiments of the invention feature a method of forming an illumination device. A plurality of device dies is provided. One or more (or even each) of the device dies includes, consists essentially of, or consists of (i) an aluminum nitride substrate, (ii) an active light-emitting structure disposed over the substrate, and (iii) a doped bottom contact layer disposed between the substrate and the active structure. The plurality of device dies are attached to a submount. The plurality of device dies are contacted with an electrolyte. During contact of the plurality of device dies with the electrolyte, an electrical potential is applied to the plurality of device dies, whereby the electrolyte etches away the aluminum nitride substrate of at least one (or even each) device die to reveal the doped bottom contact layer thereof, the doped bottom contact layer remaining substantially unetched by the electrolyte. The submount is divided into a plurality of submount portions each having at least one device die attached thereto. One of the submount portions, and the device die(s) attached thereto, is packaged in a device package, thereby forming an illumination device.

Embodiments of the invention may include one or more of the following in any of a variety of combinations. Packaging the submount portion and the device die(s) attached thereto may include, consist essentially of, or consist of (i) electrically connecting the submount portion to the device package, (ii) disposing over the device die(s) one or more rigid lenses for receiving light from the device die(s) (e.g., each die may have its own lens, or a single lens may receive light from multiple dies), and/or (iii) texturing and/or coating a surface of the doped bottom contact layer of at least one device die. The submount may include, consist essentially of, or consist of a ceramic material. The submount may include, consist essentially of, or consist of aluminum nitride, e.g., polycrystalline and/or ceramic aluminum nitride. The substrate of one or more (or even each) of the device dies may be single-crystalline. The active structure of one or more (or even each) of the device dies may include, consist essentially of, or consist of a multiple quantum well layer.

The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped bottom contact layer of one or more (or even each) of the device dies may be n-type doped or p-type doped. Contacting the plurality of device dies with the electrolyte may include, consist essentially of, or consist of partially or completely immersing the plurality of device dies in the electrolyte. All or a portion of the submount may be immersed in the electrolyte when the device dies are contacted with the electrolyte. The submount may not contact the electrolyte while the plurality of device dies are contacting the electrolyte. The doped bottom contact layer of one or more (or even each) of the device dies may not include, consist essentially of, or consist of aluminum nitride. The doped bottom contact layer of one or more (or even each) of the device dies may include, consist essentially of, or consist of AlGaN, e.g., n-type AlGaN or p-type AlGaN. The doped bottom contact layer of one or more (or even each) of the device dies may be doped at a dopant concentration no less than $10^{19}$ cm$^{-3}$. The doped bottom contact layer of one or more (or even each) of the device dies may be doped at a dopant concentration no more than $10^{20}$ cm$^{-3}$, or no more than $10^{21}$ cm$^{-3}$, or no more than $10^{22}$ cm$^{-3}$. The doped bottom contact layer of one or more (or even each) of the device dies may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In another aspect, embodiments of the invention feature a method of forming an electronic device. A plurality of device assemblies is provided. One or more (or even each) of the device assemblies includes, consists essentially of, or consists of (i) an aluminum nitride substrate, (ii) an electronic device structure disposed over the substrate, and (iii) a doped drain contact layer disposed between the substrate and the electronic device structure. The plurality of device assemblies are attached to a submount. The plurality of device assemblies are contacted with an electrolyte. During contact of the plurality of device assemblies with the electrolyte, an electrical potential is applied to the plurality of device assemblies, whereby the electrolyte etches away the aluminum nitride substrate of at least one (or even each) device assembly to reveal the doped drain contact layer thereof, the doped drain contact layer remaining substantially unetched by the electrolyte. A bottom electrode is formed over the revealed doped drain contact layer of each device assembly. Each device assembly is removed from the submount before or after formation of the bottom electrode.

Embodiments of the invention may include one or more of the following in any of a variety of combinations. The submount may include, consist essentially of, or consist of a ceramic material. The submount may include, consist essentially of, or consist of aluminum nitride, e.g., polycrystalline and/or ceramic aluminum nitride. The substrate of one or more (or even each) of the device assemblies may be single-crystalline. The electronic device structure of one or more (or even each) of the device assemblies may include, consist essentially of, or consist of a source contact layer and a channel layer.

The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped drain contact layer of one or more (or even each) of the device assemblies may be n-type doped or p-type doped. Contacting the plurality of device assemblies with the electrolyte may include, consist essentially of, or consist of partially or completely immersing the plurality of device assemblies in the electrolyte. All or a portion of the submount may be immersed in the electrolyte when the device assemblies are contacted with the electrolyte. The submount may not contact the electrolyte while the plurality of device assemblies are contacting the electrolyte. The doped drain contact layer of one or more (or even each) of the device assemblies may not include, consist essentially of, or consist of aluminum nitride. The doped drain contact layer of one or more (or even each) of the device assemblies may include, consist essentially of, or consist of AlGaN, e.g., n-type AlGaN or p-type AlGaN. The doped drain contact layer of one or more (or even each) of the device assemblies may be doped at a dopant concentration no less than $10^{19}$ cm$^{-3}$. The doped drain contact layer of one or more (or even each) of the device assemblies may be doped at a dopant concentration no more than $10^{20}$ cm$^{-3}$, or no more than $10^{21}$ cm$^{-3}$, or no more than $10^{22}$ cm$^{-3}$. The doped drain contact layer of one or more (or even each) of the device assemblies may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In yet another aspect, embodiments of the invention feature a method of forming an illumination device. A plurality of device dies is provided. One or more (or even each) of the device dies includes, consists essentially of, or consists of (i) an aluminum nitride substrate, (ii) an active light-emitting structure disposed over the substrate, and (iii) a doped bottom contact layer disposed between the substrate and the active structure. The plurality of device dies are attached to a submount. The plurality of device dies are contacted with an electrolyte. During contact of the plurality of device dies with the electrolyte, an electrical potential is applied to the plurality of device dies, whereby the electrolyte etches away the aluminum nitride substrate of at least one (or even each) device die to reveal the doped bottom contact layer thereof, the doped bottom contact layer remaining substantially unetched by the electrolyte. The device dies are removed from the submount. One of the device dies is packaged in a device package, thereby forming an illumination device.

Embodiments of the invention may include one or more of the following in any of a variety of combinations. Packaging the device die may include, consist essentially of, or consist of (i) electrically connecting the device die to the device package, (ii) disposing over the device die a rigid lens for receiving light from the device die, and/or (iii) texturing and/or coating a surface of the doped bottom contact layer of the device die. A bottom electrode may be formed on the doped bottom contact layer of the device die before (or after) packaging the device die or before (or after) etching away of the substrate. The submount may include, consist essentially of, or consist of a ceramic material. The submount may include, consist essentially of, or consist of aluminum nitride, e.g., polycrystalline and/or ceramic aluminum nitride. The substrate of one or more (or even each) of the device dies may be single-crystalline. The active structure of one or more (or even each) of the device dies may include, consist essentially of, or consist of a multiple quantum well layer.

The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped bottom contact layer of one or more (or even each) of the device dies may be n-type doped or p-type doped. Contacting the plurality of device dies with the electrolyte may include, consist essentially of, or consist of partially or completely immersing the plurality of device dies in the electrolyte. All or a portion of the submount may be immersed in the electrolyte when the device dies are contacted with the electrolyte. The submount may not contact the electrolyte while the plurality of device dies are contacting the electrolyte. The doped bottom contact layer of one or more (or even each) of the device dies may not include, consist essentially of, or consist of aluminum nitride. The doped bottom contact layer of one or more (or even each) of the device dies may include, consist essentially of, or consist of AlGaN, e.g., n-type AlGaN or p-type AlGaN. The doped bottom contact layer of one or more (or even each) of the device dies may be doped at a dopant concentration no less than $10^{19}$ cm$^{-3}$. The doped bottom contact layer of one or more (or even each) of the device dies may be doped at a dopant concentration no more than $10^{20}$ cm$^{-3}$, or no more than $10^{21}$ cm$^{-3}$, or no more than $10^{22}$ cm$^{-3}$. The doped bottom contact layer of one or more (or even each) of the device dies may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In another aspect, embodiments of the invention feature a method of forming an illumination device. A wafer is provided. The wafer defines a plurality of unsingulated light-emitting dies. The wafer includes, consists essentially of, or consists of (i) an aluminum nitride substrate, (ii) an epitaxial structure including, consisting essentially of, or consisting of a plurality of epitaxial layers disposed over the substrate, and (iii) a doped layer disposed between the substrate and the epitaxial structure. The wafer is attached to a submount. The wafer is contacted with an electrolyte. During contact of the wafer with the electrolyte, an electrical potential is applied to the wafer, whereby the electrolyte etches away the aluminum nitride substrate to reveal the doped layer, the doped layer remaining substantially unetched by the electrolyte. After the substrate is etched away, the epitaxial structure is attached to a handle wafer. The epitaxial structure is singulated into a plurality of light-emitting dies. One of the light-emitting dies is packaged in a device package, thereby forming an illumination device.

Embodiments of the invention may include one or more of the following in any of a variety of combinations. The submount may be singulated such that each of the light-emitting dies includes a portion of the submount (which may then be packaged in the device package). One or more of the light-emitting dies may be removed from the handle wafer after singulation or after packaging. At least a portion of the epitaxial structure may be removed from the submount before or after the epitaxial structure is singulated. Packaging the light-emitting die may include, consist essentially of, or consist of (i) electrically connecting the light-emitting die to the device package, (ii) disposing over the light-emitting die a rigid lens for receiving light from the light-emitting die, and/or (iii) texturing and/or coating a surface of the doped layer of the light-emitting die. A bottom electrode may be formed on the doped layer of the light-emitting die before packaging the light-emitting die, before singulation, or before attachment to the handle wafer. The submount may include, consist essentially of, or consist of a ceramic material. The submount may include, consist essentially of, or consist of aluminum nitride, e.g., polycrystalline and/or ceramic aluminum nitride. The substrate may be single-crystalline. The epitaxial structure may include, consist essentially of, or consist of a multiple quantum well layer.

The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped layer may be n-type doped or p-type doped. Contacting the wafer with the electrolyte may include, consist essentially of, or consist of partially or completely immersing the wafer in the electrolyte. All or a portion of the submount may be immersed in the electrolyte when the wafer is contacted with the electrolyte. The submount may not contact the electrolyte while the wafer is contacting the electrolyte. The doped layer may not include, consist essentially of, or consist of aluminum nitride. The doped layer may include, consist essentially of, or consist of AlGaN, e.g., n-type AlGaN or p-type AlGaN. The doped layer may be doped at a dopant concentration no less than $10^{19}$ cm$^{-3}$. The doped layer of may be doped at a dopant concentration no more than $10^{20}$ cm$^{-3}$, or no more than $10^{21}$ cm$^{-3}$, or no more than $10^{22}$ cm$^{-3}$. The doped layer may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In yet another aspect, embodiments of the invention feature a method of forming an electronic device. A wafer is provided. The wafer defines a plurality of unsingulated electronic device dies. The wafer includes, consists essentially of, or consists of (i) an aluminum nitride substrate, (ii) an epitaxial structure including, consisting essentially of, or consisting of a plurality of epitaxial layers disposed over the substrate, and (iii) a doped layer disposed between the substrate and the epitaxial structure. The wafer is attached to a submount. The wafer is contacted with an electrolyte. During contact of the wafer with the electrolyte, an electrical potential is applied to the wafer, whereby the electrolyte etches away the aluminum nitride substrate to reveal the doped layer, the doped layer remaining substantially unetched by the electrolyte. After the substrate is etched away, the epitaxial structure is attached to a handle wafer. The epitaxial structure is singulated into a plurality of electronic device dies.

Embodiments of the invention may include one or more of the following in any of a variety of combinations. The submount may be singulated such that each of the electronic device dies includes a portion of the submount. One or more of the electronic device dies may be removed from the handle wafer after singulation or after packaging. At least a portion of the epitaxial structure may be removed from the submount before or after the epitaxial structure is singulated. The doped layer may include, consist essentially of, or consist of a drain contact layer. The epitaxial structure may include, consist essentially of, or consist of a source contact layer and a channel layer. A bottom electrode may be formed on the doped layer before or after singulation, or before attachment to the handle wafer. The submount may include, consist essentially of, or consist of a ceramic material. The submount may include, consist essentially of, or consist of aluminum nitride, e.g., polycrystalline and/or ceramic aluminum nitride. The substrate may be single-crystalline.

The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped layer may be n-type doped or p-type doped. Contacting the wafer with the electrolyte may include, consist essentially of, or consist of partially or completely immersing the wafer in the electrolyte. All or a portion of the submount may be immersed in the electrolyte when the wafer is contacted with the electrolyte. The submount may not contact the electrolyte while the wafer is contacting the electrolyte. The doped layer may not include, consist essentially of, or consist of aluminum nitride. The doped layer may include, consist essentially of, or consist of AlGaN, e.g., n-type AlGaN or p-type AlGaN. The doped layer may be doped at a dopant concentration no less than $10^{19}$ cm$^{-3}$. The doped layer of may be doped at a dopant concentration no more than $10^{20}$ cm$^{-3}$, or no more than $10^{21}$ cm$^{-3}$, or no more than $10^{22}$ cm$^{-3}$. The doped layer may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In another aspect, embodiments of the invention feature a method of forming an illumination device. A device structure is provided. The device structure includes, consists essentially of, or consists of (i) an aluminum nitride substrate, (ii) an active light-emitting structure disposed over the substrate, and (iii) a doped bottom contact layer disposed between the substrate and the active structure. The device structure is attached and/or electrically connected to a submount. The device structure is contacted with an electrolyte. During contact of the device structure with the electrolyte, an electrical potential is applied to the device structure, whereby the electrolyte etches away the aluminum nitride substrate to reveal the doped bottom contact layer, the doped bottom contact layer remaining substantially unetched by the electrolyte.

Embodiments of the invention may include one or more of the following in any of a variety of combinations. The substrate may be single-crystalline. The active structure may include, consist essentially of, or consist of a multiple quantum well layer. The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped bottom contact layer may be n-type doped or p-type doped. Contacting the device structure with the electrolyte may include, consist essentially of, or consist of partially or completely immersing the device structure in the electrolyte. All or a portion of the submount may be immersed in the electrolyte when the device structure is contacted with the electrolyte. The submount may not contact the electrolyte while the device structure is contacting the electrolyte. A surface of the doped bottom contact layer may be textured and/or coated after etching away the aluminum nitride substrate. The device structure may include, consist essentially of, or consist of a singulated die, multiple singulated dies, multiple unsingulated dies, or multiple partially unsingulated dies (i.e., dies only partially separated from each other by, e.g., trenches or cuts therebetween). The doped bottom contact layer may not include, consist essentially of, or consist of aluminum nitride. The doped bottom contact layer may include, consist essentially of, or consist of AlGaN, e.g., n-type AlGaN or p-type AlGaN. The doped bottom contact layer may be doped at a dopant concentration no less than $10^{19}$ cm$^{-3}$. The doped bottom contact layer may be doped at a dopant concentration no more than $10^{20}$ cm$^{-3}$, or no more than $10^{21}$ cm$^{-3}$, or no more than $10^{22}$ cm$^{-3}$. The doped bottom contact layer may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

In yet another aspect, embodiments of the invention feature a method of forming an electronic device. A device structure is provided. The device structure includes, consists essentially of, or consists of (i) an aluminum nitride substrate, (ii) an electronic device structure disposed over the substrate, and (iii) a doped drain contact layer disposed between the substrate and the electronic device structure. The device structure is attached and/or electrically connected to a submount. The device structure is contacted with an electrolyte. During contact of the device structure with the electrolyte, an electrical potential is applied to the device structure, whereby the electrolyte etches away the aluminum nitride substrate to reveal the doped drain contact layer, the doped bottom contact layer remaining substantially unetched by the electrolyte.

Embodiments of the invention may include one or more of the following in any of a variety of combinations. The substrate may be single-crystalline. The electronic device structure may include, consist essentially of, or consist of a source contact layer and a channel layer. The electrical potential may be negative or positive. The electrolyte may be basic or acidic. The electrolyte may include, consist essentially of, or consist of potassium hydroxide or sodium hydroxide. The electrolyte may include, consist essentially of, or consist of nitric acid. The electrolyte may include water (e.g., deionized water). The doped drain contact layer may be n-type doped or p-type doped. Contacting the device structure with the electrolyte may include, consist essentially of, or consist of partially or completely immersing the device structure in the electrolyte. All or a portion of the submount may be immersed in the electrolyte when the device structure is contacted with the electrolyte. The submount may not contact the electrolyte while the device structure is contacting the electrolyte. The device structure may include, consist essentially of, or consist of a singulated die, multiple singulated dies, multiple unsingulated dies, or multiple partially unsingulated dies (i.e., dies only partially separated from each other by, e.g., trenches or cuts therebetween). The doped drain contact layer may not include, consist essentially of, or consist of aluminum nitride. The doped drain contact layer may include, consist essentially of, or consist of AlGaN, e.g., n-type AlGaN or p-type AlGaN. The doped drain contact layer may be doped at a dopant concentration no less than $10^{19}$ cm$^{-3}$. The doped drain contact layer may be doped at a dopant concentration no more than $10^{20}$ cm$^{-3}$, or no more than $10^{21}$ cm$^{-3}$, or no more than $10^{22}$ cm$^{-3}$. The doped drain contact layer may have a Ga concentration of at least 10% (e.g., a Ga concentration ranging from 10% to approximately 90%, ranging from 10% to approximately 80%, ranging from 10% to approximately 70%, ranging from 10% to approximately 60%, ranging from 10% to approximately 50%, ranging from 10% to approximately 40%, ranging from 10% to approximately 30%, ranging from 10% to approximately 20%, ranging from 20% to approximately 90%, ranging from 20% to approximately 80%, ranging from 20% to approximately 70%, ranging from 20% to approximately 60%, ranging from 20% to approximately 50%, ranging from 20% to approximately 40%, or ranging from 20% to approximately 30%).

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
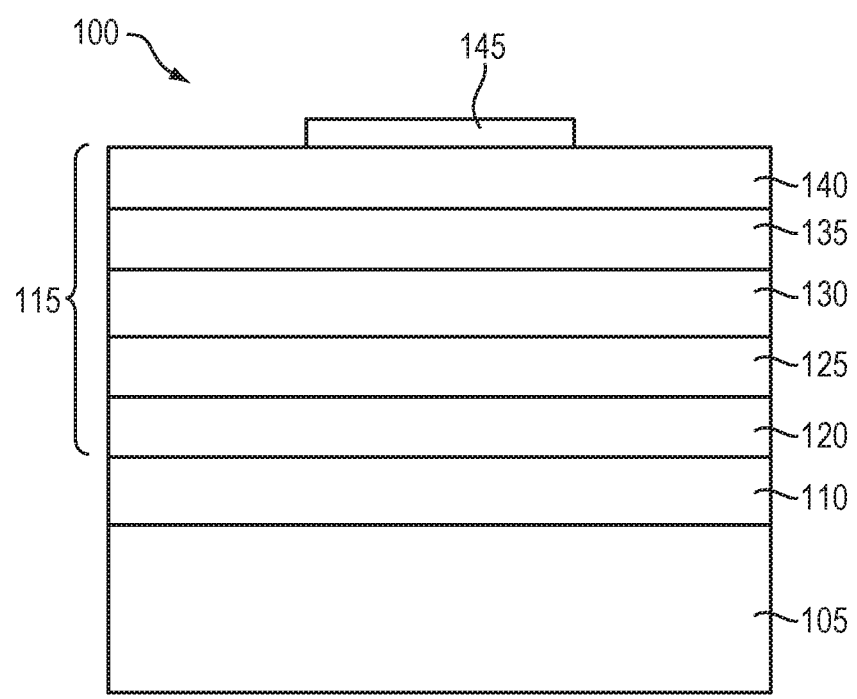
FIG. 1A is a schematic cross-section of a light-emitting device structure in accordance with various embodiments of the invention.

FIG. 1A schematically depicts a light-emitting device structure 100 in accordance with embodiments of the present invention. Light-emitting device structures 100 in accordance with embodiments of the invention may include, consist essentially of, or consist of, for example, light-emitting diodes or lasers. As shown, the device structure 100 includes a substrate 105, which in various embodiments includes, consists essentially of, or consists of aluminum nitride, e.g., single-crystal aluminum nitride. In various embodiments, the substrate 105 is not transparent (or not completely transparent) to radiation emitted by the device structure 100 (e.g., UV radiation), and thus removal of all or a portion of the substrate 105 typically improves the photon extraction from the device structure 100. Substrate 105 may be miscut such that the angle between its c-axis and its surface normal is between approximately 0° and approximately 4°. In various embodiments, the misorientation of the surface of substrate 105 is less than approximately 0.3°, e.g., for substrates 105 that are not deliberately or controllably miscut. In other embodiments, the misorientation of the surface of substrate 105 is greater than approximately 0.3°, e.g., for substrates 105 that are deliberately and controllably miscut. In various embodiments, the direction of the miscut is towards the a-axis.

The surface of substrate 105 may have a group-III (e.g., Al-) polarity, and may be planarized, e.g., by chemical-mechanical polishing. The RMS surface roughness of substrate 105 may be less than approximately 0.5 nm for a 10 µm×10 µm area. In some embodiments, atomic-level steps are detectable on the surface when probed with an atomic-force microscope. The threading dislocation density of substrate 105 may be measured using, e.g., etch pit density measurements after a 5 minute KOH—NaOH eutectic etch at 450° C. In various embodiments, the threading dislocation density is less than approximately $2 \times 10^3$ cm$^{-2}$. In some embodiments substrate 105 has an even lower threading dislocation density. Substrate 105 may be topped with a homoepitaxial layer 110 that includes, consists essentially of, or consists of AlN, e.g., undoped AlN. In addition, at least a portion of substrate 105 may itself be undoped to facilitate removal thereof by electrochemical etching, as detailed below. In various embodiments, even if an AlN substrate 105 is doped by one or more dopant species, the substrate 105 typically is less electrically conductive than doped non-AlN layers disposed thereover; thus, AlN substrates 105 may be straightforwardly removed via an electrochemical etch process preferentially stopping at such overlying layers, as detailed below. That is, various embodiments of the present invention may be utilized to remove AlN substrates 105 regardless of any dopant concentration therein.

The various layers of device structure 100 disposed over substrate 105 may be formed by any of a variety of different techniques, e.g., epitaxial growth techniques such as chemical vapor deposition (CVD) methods such as metalorganic CVD (MOCVD).

Device structure 100 also includes an active light-emitting structure 115 disposed over the homoepitaxial layer 110, as shown in FIG. 1A. For example, the active structure 115 typically includes a bottom contact layer 120. In various embodiments, the bottom contact layer 120 is n-type doped, e.g., doped with an impurity such as P, As, Sb, C, H, F, O, Mg, and/or Si. The bottom contact layer 120 may include, consist essentially of, or consist of, for example, AlN or $Al_xGa_{1-x}N$. In an embodiment, an optional graded buffer layer (not shown) is disposed above substrate 105 and below bottom contact layer 120 (e.g., between bottom contact layer 120 and homoepitaxial layer 110, if layer 110 is present). The graded buffer layer may include, consist essentially of, or consist of one or more semiconductor materials, e.g., $Al_xGa_{1-x}N$. In various embodiments, the graded buffer layer has a composition approximately equal to that of substrate 105 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 120 may be chosen to be close to (e.g., approximately equal to) that of the desired active region of the device (e.g., the $Al_xGa_{1-x}N$ concentration that will result in the desired wavelength emission from the light-emitting device). In various embodiments, the graded layer is undoped in order to facilitate removal thereof by electrochemical etching. In an embodiment, the graded buffer layer includes, consists essentially of, or consists of undoped $Al_xGa_{1-x}N$ graded from an Al concentration x of approximately 100% to an Al concentration x of approximately 60%.

The bottom contact layer 120 may have a thickness sufficient to prevent current crowding after device fabrication and/or to stop on during etching to fabricate contacts. For example, the thickness of bottom contact layer 120 may range from approximately 100 nm to approximately 500 nm, or from approximately 100 nm to approximately 2 µm. When utilizing a bottom contact layer 120, the final light-emitting device may be fabricated with back-side contacts after removal of all or part of substrate 105 (and homoepitaxial layer 110, if present). In various embodiments, bottom contact layer 120 will have high electrical conductivity even with a small thickness due to the low defect density maintained when the layer is pseudomorphic. Thus, in embodiments of the invention, the thickness of bottom contact layer 120 is sufficiently small to result in the layer remaining pseudomorphic, as detailed in U.S. patent application Ser.

No. 12/020,006, filed on Jan. 25, 2008, and U.S. patent application Ser. No. 12/764,584, filed on Apr. 21, 2010, the entire disclosure of each of which is incorporated by reference herein. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 115 is configured for the emission of light in response to an applied voltage. Thus, the active structure 115 may include a multiple-quantum well ("MQW") layer 125 disposed above bottom contact layer 120. In various embodiments, MQW layer 125 is disposed directly on the bottom contact layer 120. In other embodiments, an optional layer (e.g., an undoped layer including, consisting essentially of, or consisting of an undoped semiconductor material such as AlGaN) may be disposed between the bottom contact layer 120 and the MQW layer 125. The MQW layer 125 may be doped with the same doping polarity as the bottom contact layer 120, e.g., n-type doped. The MQW layer 125 may include, consist essentially of, or consist of one or more quantum wells separated by (or surrounded on both sides by) barriers. For example, each period of MQW layer 125 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 125 may include a plurality of such periods, and may have a total thickness ranging from 20 nm to 100 nm, or less than approximately 50 nm.

In various embodiments of the invention, an electron-blocking layer 130 may be disposed over MQW layer 125. The electron-blocking layer 130 typically has a wider band gap than that of a band gap within the MQW layer 125 (e.g., a band gap of the barrier layers therewithin). In various embodiments, the electron-blocking layer 130 may include, consist essentially of, or consist of e.g., $Al_xGa_{1-x}N$, and electron-blocking layer 130 may be doped. For example, the electron-blocking layer 130 may be doped with the same doping polarity as that of bottom contact layer 120 and/or MQW layer 125 (e.g., n-type doped). In various embodiments, the value of x in the electron-blocking layer 130 is greater than the value of the Al mole fraction in the barrier layers used in the MQW layer 125. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 130 may have a thickness that may range, for example, between approximately 10 nm and approximately 50 nm, or even between approximately 10 nm and approximately 30 nm. In various embodiments of the invention, the electron-blocking layer 130 is sufficiently thin (e.g., thickness less than about 30 nm, or less than about 20 nm) so as to facilitate carrier (e.g., hole) tunneling through the electron-blocking layer 130. In various embodiments of the invention, the electron-blocking layer 130 is omitted from device structure 100.

As shown in FIG. 1A, device structure 100 may also include a graded layer 135 disposed above the electron-blocking layer 130 (or above the MQW layer 125 in embodiments in which electron-blocking layer 130 is omitted), and a cap layer 140 may be disposed over the graded layer 135. The cap layer 140 may be doped with a doping polarity opposite of that of the bottom contact layer 120, e.g., p-type doped with one or more dopants such as Mg, Be, and/or Zn. In other embodiments, the cap layer 140 may be undoped, as carriers (e.g., holes) may be injected from an electrode into a two-dimensional carrier gas disposed at the interface between the cap layer 140 and the graded layer 135. (While in exemplary embodiments described herein the cap layer 140 is doped p-type and the bottom contact layer 120 is doped n-type, embodiments in which the doping polarities of these layers are switched are within the scope of the present invention; in such embodiments, the electron-blocking layer 130, if present, may be considered to be a "hole-blocking layer," as understood by those of skill in the art.) The cap layer 140 may have a thickness ranging from, e.g., approximately 1 nm to approximately 100 nm, or approximately 1 nm to approximately 50 nm, or approximately 1 nm to approximately 20 nm. In various embodiments, the cap layer 140 includes, consists essentially of, or consists of $Al_xGa_{1-x}N$, and in various embodiments the aluminum concentration x may range from 0 (i.e., pure GaN) to approximately 0.2.

The device structure 100 may also incorporate one or more metallic contacts to facilitate electrical contact to the device. For example, a metallic contact may include or consist essentially of an electrode layer 145 disposed above or on the cap layer 140. The composition and/or shape of the electrode layer 145 are not particularly limited as long as it enables the injection of carriers (e.g., holes) into the cap layer 140. In embodiments in which holes are injected into a p-type doped nitride-based semiconductor cap layer 140, the electrode layer 145 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 140, the electrode layer 145 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 145 in accordance with embodiments of the invention are not limited to these materials. The thickness of the electrode layer 145 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 145 is formed after removal of all or a portion of the substrate 105.

Figure 1B:
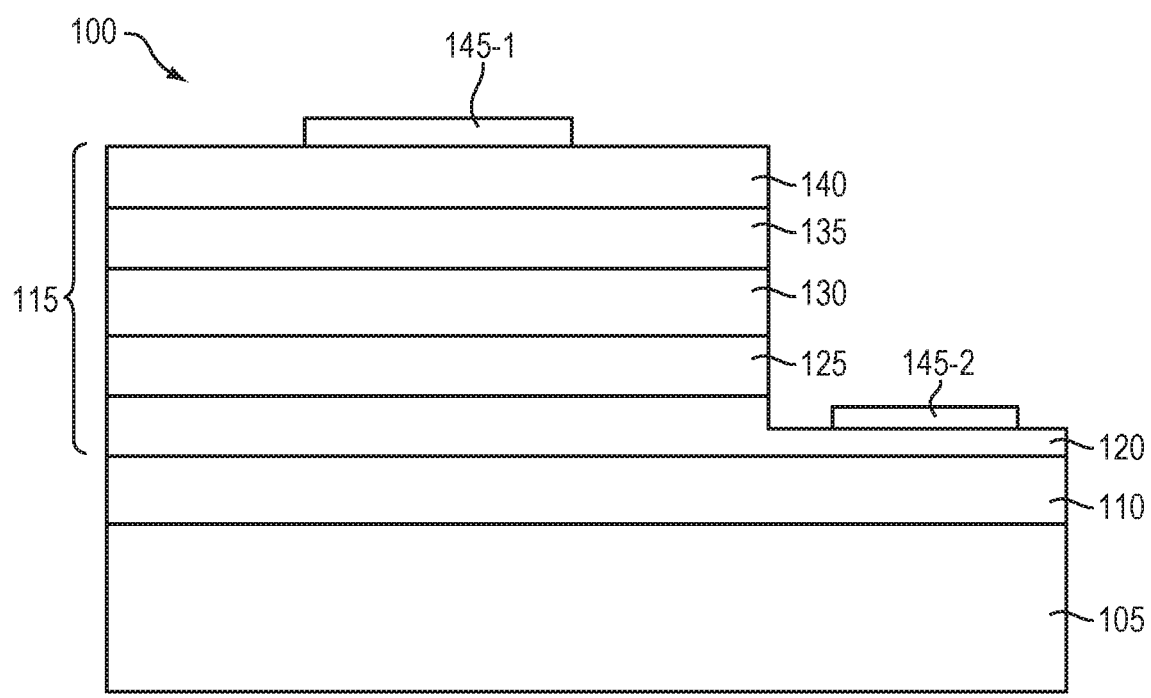
FIG. 1B is a schematic cross-section of a light-emitting device structure in accordance with various embodiments of the invention.

Various embodiments of the present invention feature device structures 100 incorporating two top electrodes 145, one making contact to bottom contact layer 120 and the other making contact to the cap layer 140. FIG. 1B depicts such an exemplary variant of device structure 100. As shown, a portion of the active structure 115 has been removed (via, e.g., conventional photolithographic masking and etching) such that a portion of bottom contact layer 120 is revealed, and then an electrode 145-2 has been fabricated on bottom contact layer 120. An electrode 145-1 has been fabricated atop cap layer 140, as in FIG. 1A.

As mentioned above, embodiments of the present invention feature a graded layer 135 disposed between the cap layer 140 and the electron-blocking layer 130 (or the MQW layer 125 in embodiments in which the electron-blocking layer 130 is omitted). The graded layer 135 typically includes, consists essentially of, or consists of a nitride semiconductor, e.g., a mixture or alloy of Ga, In, and/or Al with N. The compositional gradient within graded layer 135 may be substantially continuous or stepped, and the grading rate within the graded layer 135 may be substantially constant or may change one or more times within the thickness of graded layer 135. The graded layer 135 may be undoped. In other embodiments, the graded layer 135 is doped n-type or p-type with one or more dopants, e.g., C, H, F, O, Mg, Be, Zn, and/or Si. The thickness of the graded layer 135 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 100 may be temporarily halted between growth of the graded layer 135 and the underlying layer and/or the overlying layer. In various embodiments, the graded layer 135 is pseudomorphically strained to one or more of the underlying layers.

In various embodiments of the invention, one or more (or even all) of the layers of device structure 100 formed over substrate 105 may be pseudomorphically strained, similar to device layers described in U.S. patent application Ser. No. 12/020,006, filed on Jan. 25, 2008, U.S. patent application Ser. No. 12/764,584, filed on Apr. 21, 2010, and U.S. patent application Ser. No. 14/208,379, filed on Mar. 13, 2014, the entire disclosure of each of which is incorporated by reference herein. Thus, as detailed therein, in various embodiments, one or more of the layers of device structure 100 may be pseudomorphic and may have a thickness greater than its predicted (e.g., via the Maxwell-Blakeslee theory) critical thickness. Moreover, the collective layer structure of device structure 100 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 100 are pseudomorphically strained and cap layer 140 is partially or substantially fully relaxed. For example, the lattice mismatch between cap layer 140 and substrate 105 and/or MQW layer 135 may be greater than approximately 1%, greater than approximately 2%, or even greater than approximately 3%. In an exemplary embodiment, cap layer 140 includes, consists essentially of, or consists of undoped or doped GaN, substrate 105 includes, consists essentially of, or consists of doped or undoped AlN (e.g., single-crystal AlN), and MQW layer 125 includes, consists essentially of, or consists of multiple $Al_{0.55}Ga_{0.45}N$ quantum wells interleaved with $Al_{0.75}Ga_{0.25}N$ barrier layers, and cap layer 140 is lattice mismatched by approximately 2.4%. Cap layer 140 may be substantially relaxed, i.e., may have a lattice parameter approximately equal to its theoretical unstrained lattice constant. A partially or substantially relaxed cap layer 140 may contain strain-relieving dislocations having segments threading to the surface of cap layer 140 (such dislocations may be termed "threading dislocations"). The threading dislocation density of a relaxed cap layer 140 may be larger than that of substrate 105 and/or layers underlying cap layer 140 by, e.g., one, two, or three orders of magnitude, or even larger.

Figure 2:
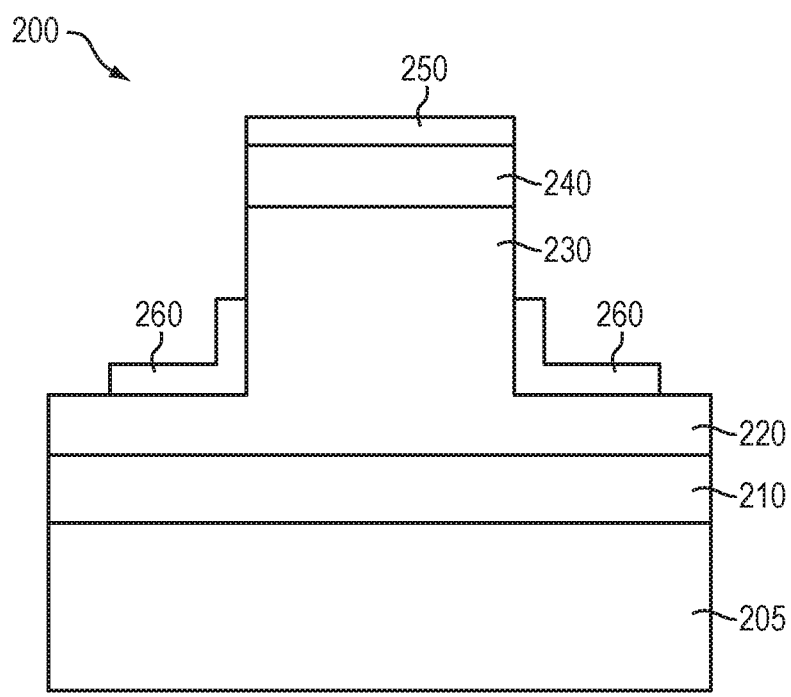
FIG. 2 is a schematic cross-section of an electronic device structure in accordance with various embodiments of the invention.

FIG. 2 is a cross-sectional schematic of an exemplary electronic device structure 200 that may be utilized in accordance with embodiments of the present invention. The various layers of device structure 200 disposed over substrate 105 may be formed by any of a variety of different techniques, e.g., epitaxial growth techniques such as CVD (e.g., MOCVD). As shown, device structure 200 includes a drain contact layer 210, a drift layer 220, a channel layer 230, and a cap (or "source contact") layer 240 epitaxially formed over the substrate 105. A source electrode 250 may be disposed over the source contact layer 240, and a gate electrode 260 may contact the channel layer 230. As shown, various layers of device structure 200 may be patterned and etched to form a pillar, and the gate electrode 260 may wrap around all or a portion of the channel layer 230.

In various embodiments, the drain contact layer 210 is n-type doped, e.g., doped with an impurity such as P, As, Sb, C, H, F, O, Mg, and/or Si. The drain contact layer 210 may include, consist essentially of, or consist of, for example, $Al_xGa_{1-x}N$, e.g., AlGaN having a Ga content of at least 10%-30%. In an embodiment, an optional graded buffer layer (not shown) is disposed above substrate 105 and below drain contact layer 210. The graded buffer layer may include, consist essentially of, or consist of one or more semiconductor materials, e.g., $Al_xGa_{1-x}N$. In various embodiments, the graded buffer layer has a composition approximately equal to that of substrate 105 at the bottom interface of the graded buffer layer in order to promote two-dimensional growth and avoid deleterious islanding, as described above. The composition of the graded buffer layer at an interface with drain contact layer 210 may be chosen to be close to (e.g., approximately equal to) that of the drain contact layer 210. In various embodiments, the graded layer is undoped in order to facilitate removal thereof by electrochemical etching. In an embodiment, the graded buffer layer includes, consists essentially of, or consists of undoped $Al_xGa_{1-x}N$ graded from an Al concentration x of approximately 100% to an Al concentration x of approximately 60%-80%. The final electronic device based on device structure 200 may be fabricated with a back-side drain electrode that is disposed on the drain contact layer after removal of substrate 105. In various embodiments, the drain contact layer 210 is pseudomorphic.

In various embodiments, the drift layer 220 and/or the channel layer 230 may include, consist essentially of, or consist of, for example, $Al_xGa_{1-x}N$ or GaN that is doped at a lower level but with the same polarity as the doping of the drain contact layer 210. For example, if the drain contact layer 210 is highly p-doped, than the drift layer 220 and/or the channel layer 230 may be p-doped at a lower dopant concentration. Similarly, if the drain contact layer 210 is highly n-doped, than the drift layer 220 and/or the channel layer 230 may be n-doped at a lower dopant concentration. The portion of the channel layer 230 proximate the gate electrode 260 may be doped with the polarity opposite that of the drain contact layer 210 (e.g., p-doped for an n-doped drain contact layer), as voltage applied to the gate electrode 260 may be utilized to control current flow in device 200 from the source contact 240, through the channel layer 230, to the drain contact 210, or vice versa. The source contact layer 240 may be doped with the same polarity as drain contact 210 and also at a high level of dopant concentration, in order to minimize resistivity of the contact to the source electrode 250. In various embodiments, the source contact layer 240 may include, consist essentially of, or consist of doped GaN or AlGaN (e.g., AlGaN having approximately 60% Ga to approximately 90% Ga). In accordance with various embodiments of the invention, various ones, or even all, of the layers in device structure 200 may be pseudomorphically strained.

As shown in FIG. 2, the device structure 200 may also incorporate one or more metallic contacts to facilitate electrical contact to the device, e.g., source electrode 250, gate electrode 260, and a drain electrode contacting drain contact 210 (not shown in FIG. 2). The compositions and/or shapes of the electrode layers are not particularly limited as long as they enable the injection of carriers into the device structure. In various embodiments, one or more (or even all) of the electrodes are formed after removal of all or a portion of the substrate 105.

Figure 3A:
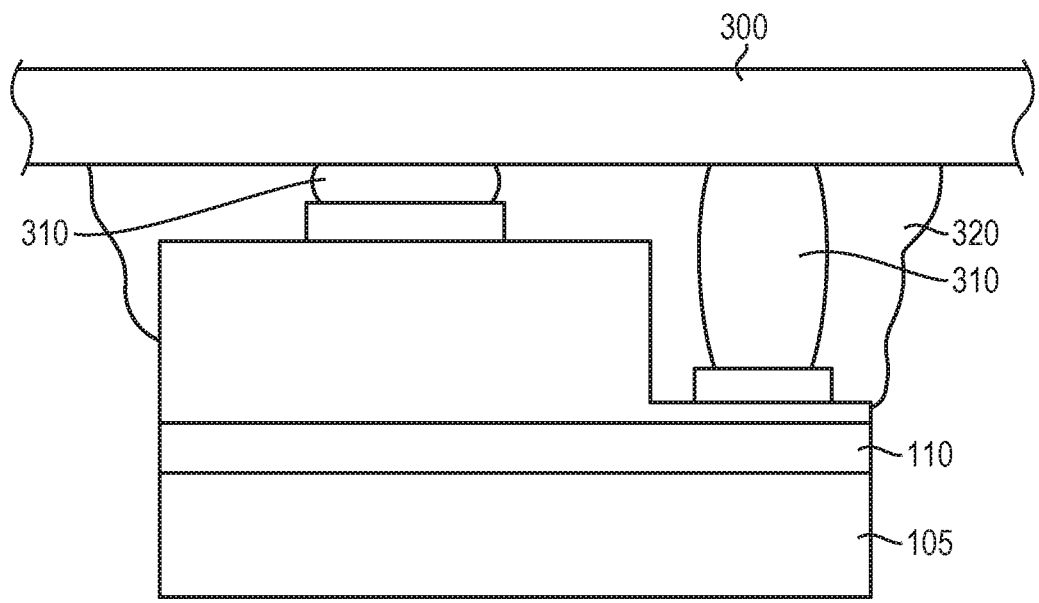
FIG. 3A is a schematic cross-section of a light-emitting device structure attached to a submount in accordance with various embodiments of the invention.
Figure 3B:
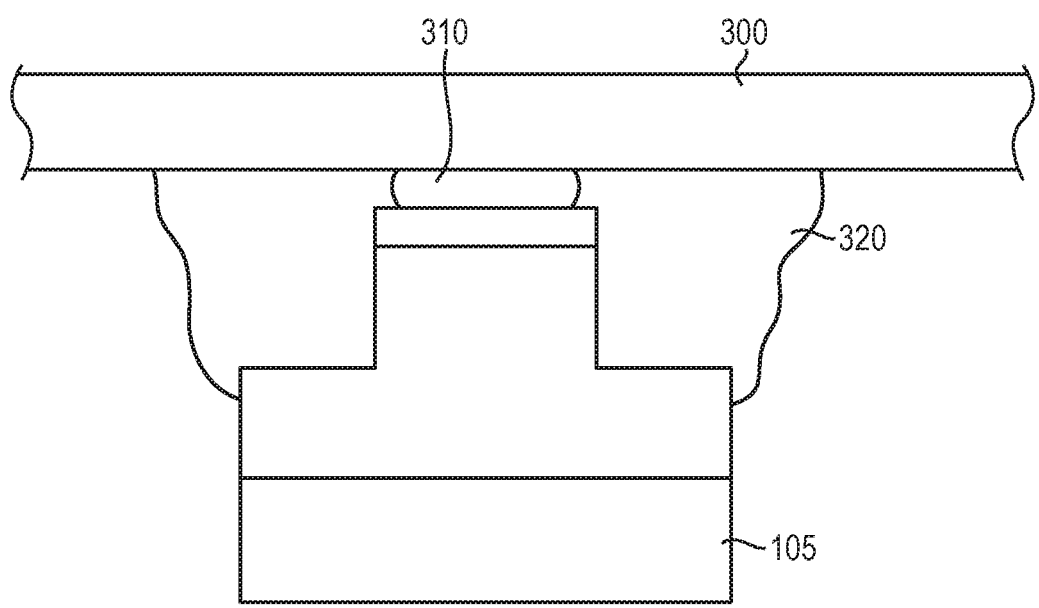
FIG. 3B is a schematic cross-section of an electronic device structure attached to a submount in accordance with various embodiments of the invention.

In accordance with embodiments of the present invention, an electrochemical etch process is utilized to remove all or a portion of substrate 105 (and undoped homoepitaxial layer 110, if present) from the rest of device structure (or "die") 100 or 200. One or more singulated dies 100 or 200 may be attached to a submount that is electrically connected to each die 100 or 200 for the etch process. In various embodiments, as shown in FIGS. 3A and 3B, individual dies 100 or 200 may be attached to a submount 300 via one or more electrical connections 310, e.g., one or more ball bonds, conductive pillars, wire bonds, or interconnects. For example, each die 100 or 200 may be bonded to the submount 300 via a gold-to-gold interconnect process via application of heat, pressure, and/or ultrasonic power, as known to those of skill in the art. As shown in FIGS. 3A and 3B, an underfill material 320 (e.g., wax and/or epoxy) may be utilized to protect various layers of die 100 or 200 from the etching process while leaving the substrate 105 exposed. In various embodiments, the submount 300 includes, consists essentially of, or consists of a thermally conductive but electrically insulating material, e.g., an AlN ceramic. The submount 300 may have one or more conductive (e.g., metallic) electrodes on each of its top and bottom surfaces, and such top and bottom electrodes may be electrically connected to each other by one or more conductive (e.g., metallic) vias extending through the thickness of submount 300. The one or more dies 100 or 200 may each be coupled to one or more of the electrodes on the submount 300.

Figure 4:
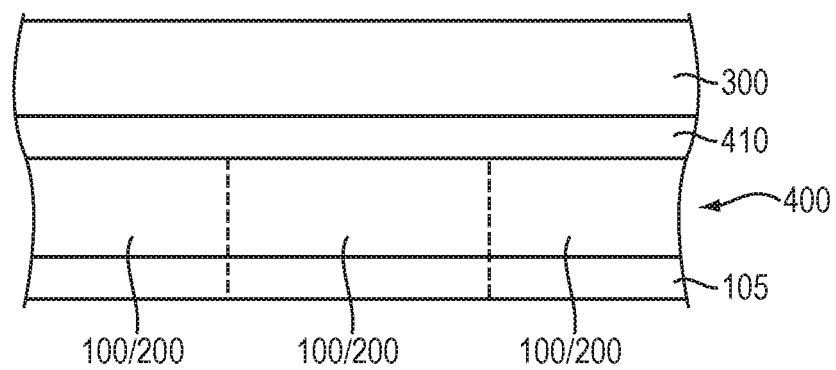
FIG. 4 is a schematic cross-section of an unsingulated substrate attached to a submount in accordance with various embodiments of the invention.

In other embodiments, multiple dies 100 or 200 that are at least partially unsingulated from each other may be attached to the submount 300 for etching, as shown in FIG. 4. For example, all or a portion of a wafer 400 having dies 100 or 200 fabricated thereon may be attached to the submount 300 via, e.g., a conductive layer 410 such as a metallic layer and/or a conductive adhesive.

Figure 5A:
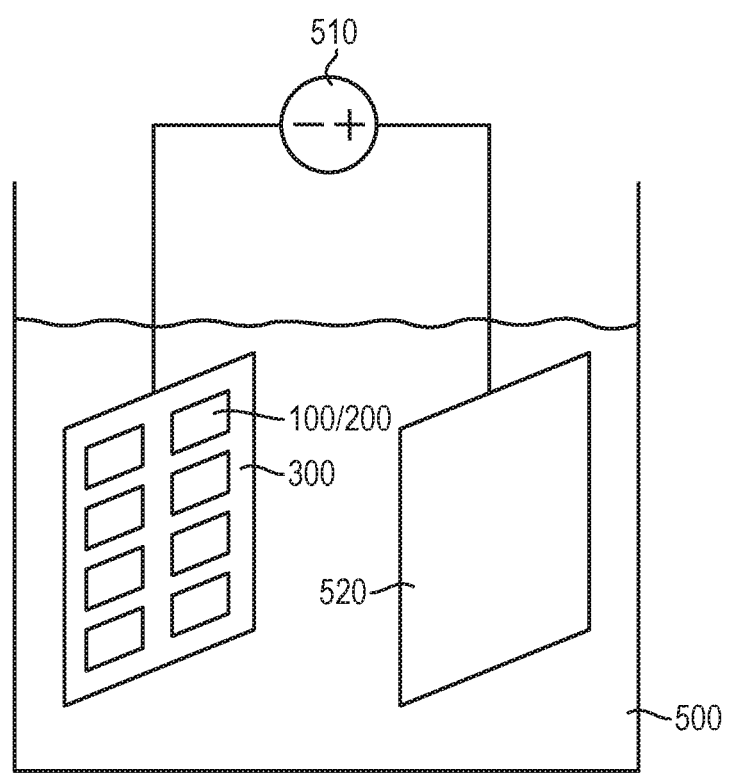
FIG. 5A is a schematic diagram of an apparatus for electrochemical etching in accordance with various embodiments of the invention.

In accordance with embodiments of the invention, at least portions of the dies 100 or 200 (e.g., the substrates thereof) are exposed to an electrolyte for electrochemical etching. For example, as shown in FIG. 5A, the submount 300 with the dies 100 or 200 thereon may be immersed in an electrolyte 500 and electrically coupled to a power source 510 (e.g., a battery or a power supply such as a direct-current power supply). The power source 510 is also electrically coupled to an electrode 520 that is also partially or fully immersed in the electrolyte 500. In various embodiments, the electrode 520 includes, consists essentially of, or consists of platinum and/or another noble metal resistant to etching by the electrolyte 500. (While FIG. 5A depicts individual singulated dies 100 or 200 attached to the submount 300, embodiments of the invention also include configurations in which multiple unsingulated dies, as shown in FIG. 4, are attached to the submount 300.) Electrode 520, which may function as either the cathode or anode during the electrochemical etch process, may include, consist essentially of, or consist of, for example, a metallic plate or mesh. In various embodiments, the electrolyte 500 includes, consists essentially of, or consists of a basic solution (e.g., a solution including, consisting essentially of, or consisting of KOH and/or NaOH), and a negative potential is applied to the submount 300 (and thus to the dies 100 or 200). In other embodiments, the electrolyte includes, consists essentially of, or consists of an acidic solution (e.g., a solution including, consisting essentially of, or consisting of nitric acid, phosphoric acid, and/or hydrochloric acid), and a positive potential is applied to the submount 300. In various embodiments, the electrolyte 500 may be heated (e.g., to a temperature of approximately 30° C. to approximately 150° C., or even approximately 50° C. to approximately 150° C.). While the electrical potential is applied, the exposed substrate 105 (and homoepitaxial layer 110, if present) of each of the dies 100 or 200, which is not appreciably electrically conductive, is etched away by the electrolyte 500. Since the portion of the layer structure directly above the substrate 105 (e.g., the bottom contact layer 120 or the drain contact 210) is doped and typically is composed of a material other than AlN (and thus is electrically conductive), the etching process automatically stops after removal of the substrate 105. That is, the etching process selectively removes only the undoped portion (or portion otherwise having low electrical conductivity, e.g., including, consisting essentially of, or consisting of AlN) of the dies 100 or 200.

Figure 5B:
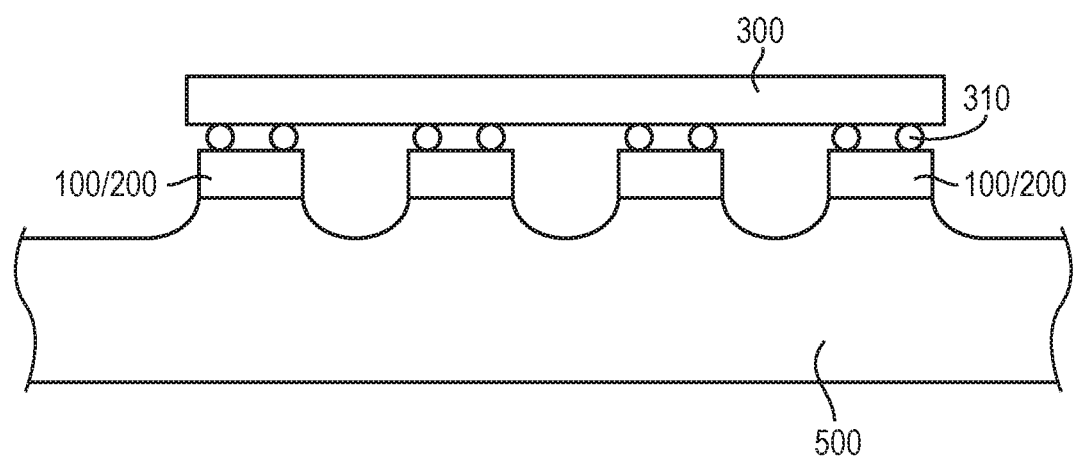
FIG. 5B is a schematic diagram of non-immersive electrochemical etching in accordance with various embodiments of the invention.

As shown in FIG. 5B, the entirety of each die 100 or 200 and/or the submount 300 need not be immersed in the electrolyte 500 in accordance with embodiments of the present invention. Instead, the submount 300 may be positioned over the surface of the electrolyte 500 such than only a portion of each of the dies 100 or 200 comes into contact with or is immersed in the electrolyte 500. (As shown in FIG. 5B, such contact may be facilitated if, for example, the surface of electrolyte 500 forms a meniscus, and the dies 100 or 200 may be brought into contact therewith.) In such embodiments, the etching of the substrate 105 for each of the dies proceeds as detailed above, and automatically stops after the substrate 105 is removed and an electrically conductive layer thereover is exposed. In addition, in such "non-immersion" embodiments, the electrode 520 may itself be immersed in the electrolyte 500 (as shown in FIG. 5A), or the electrode 520 may merely be in contact with the electrolyte 500 rather than being fully immersed therein.

Figure 6A:
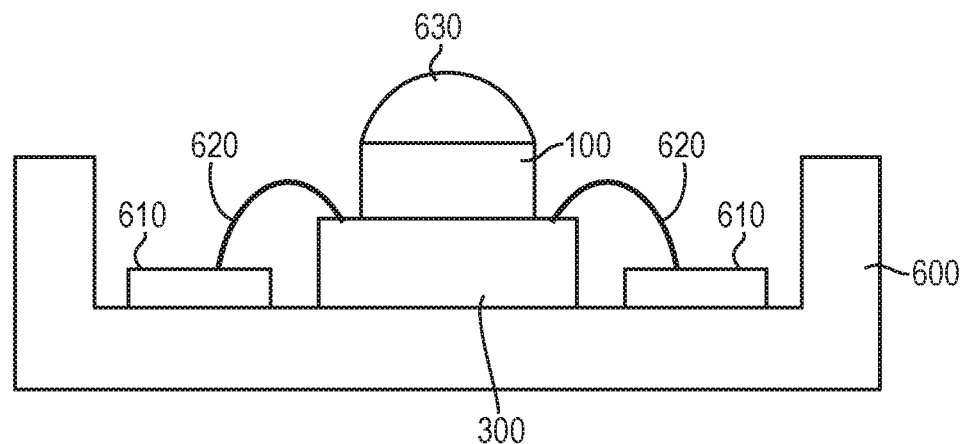
FIG. 6A is a schematic diagram of a packaged device after substrate removal in accordance with various embodiments of the invention.

After the completion of the etching process, the etched die(s) may be rinsed (e.g., with deionized water) or otherwise cleaned. Thereafter, for dies 100, the revealed surface of the bottom contact layer 120 may be textured (e.g., roughened) or coated in order to further facilitate photon extraction therefrom. For example, the surface of the bottom contact layer 120 may be coated with a layer of material having an index of refraction between that of bottom contact layer 120 and that of air. As shown in FIG. 6A, a submount 300 having singulated dies 100 thereon may itself be singulated after the etching process, and the mounted die and submount portion may be disposed in a package 600. As shown, portions of the submount electrically connected to each of the electrodes of the die 100 may be electrically connected to different contacts 610 of the package 600 via, e.g., wire bonds 620. (Note that the means of electrically connecting the die electrodes to the submount are not shown in FIG. 6A for clarity.) As shown in FIG. 6A, a lens 630 may be disposed on or over the etch-revealed surface of die 100 instead of or in addition to any coating applied thereover. For example, lens 630 may be a rigid inorganic lens resistant to degradation induced by exposure to UV light, as detailed in U.S. Pat. No. 8,962,359, filed on Jul. 19, 2012, U.S. Pat. No. 9,293,670, filed on Apr. 6, 2015, and U.S. Pat. No. 9,935,247, filed on Jul. 23, 2015, the entire disclosure of each of which is incorporated by reference herein.

Figure 6B:
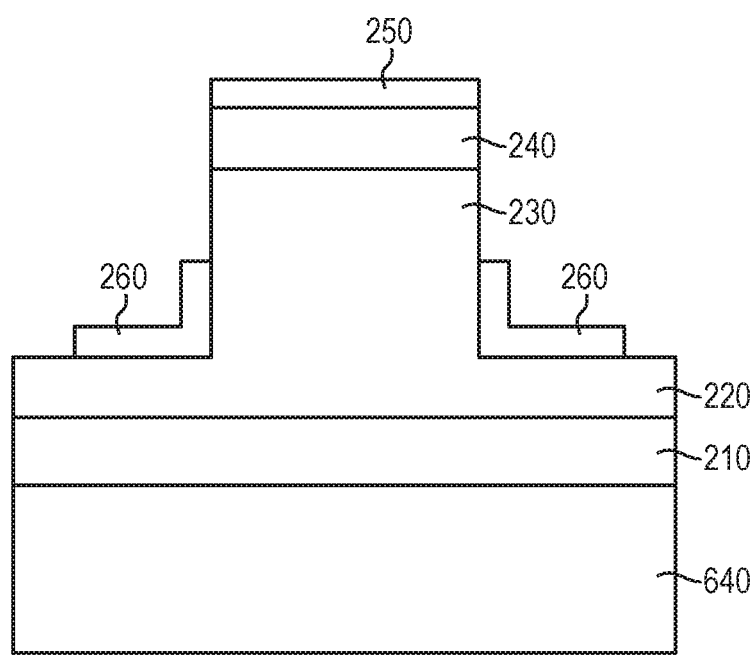
FIG. 6B is a schematic cross-section of a device after substrate removal and electrode formation in accordance with various embodiments of the invention.

Similarly, as shown in FIG. 6B, after removal of the substrate 105 from dies 200, a drain electrode 640 (which may include, consist essentially of, or consist of, e.g., one or more metals) may be formed over the drain contact 210 revealed by the substrate removal, thereby forming a low-resistivity contact. The formation of the drain electrode 640 may be performed while the die 200 is attached to the submount 300 (or a portion thereof) or after removal therefrom.

Figure 6C:
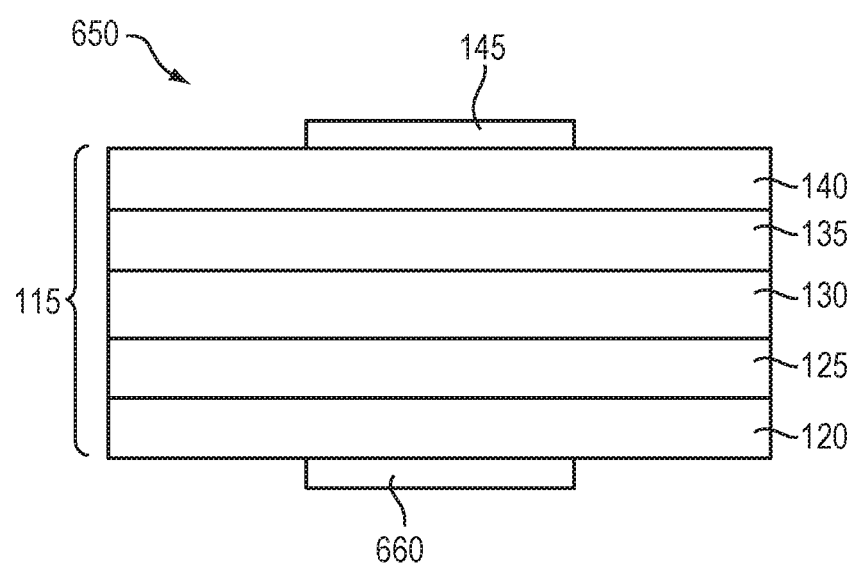
FIG. 6C is a schematic cross-section of a light-emitting device structure after substrate removal in accordance with various embodiments of the invention.
Figure 6D:
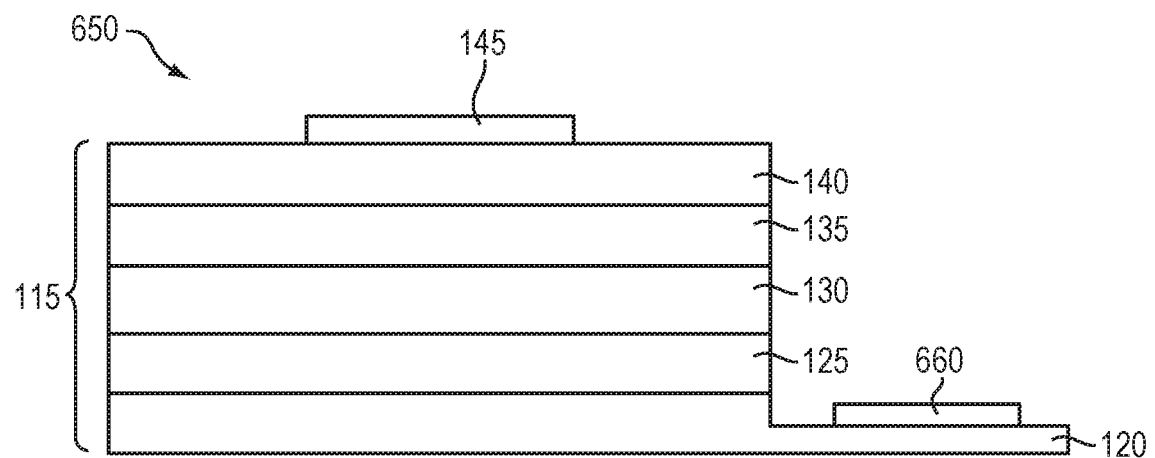
FIG. 6D is a schematic cross-section of a light-emitting device structure after substrate removal in accordance with various embodiments of the invention.

As mentioned above, after removal of all or a portion of the substrate 105, electrical contacts may be made to the bottom contact layer 120 and the cap layer 140 (assuming that such a contact was not already formed prior to substrate removal) so that power may be applied to the device structure 100, resulting in light emission therefrom. FIGS. 6C and 6D depict different device structures 650 in accordance with various embodiments, in which a bottom electrode layer 660 is formed below the newly exposed bottom contact layer 120 after removal of the substrate 105 (FIG. 6C) and on top of a portion of bottom contact layer 120 after removal of the substrate 105 and masking and removal of a portion of the active structure 115 (FIG. 6D). The composition and/or shape of the bottom electrode layer 660 are not particularly limited as long as it enables the injection of carriers (e.g., electrons) into the bottom contact layer 120. In embodiments in which electrons are injected into an n-type doped nitride-based semiconductor bottom contact layer 120, the bottom electrode layer 660 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 120, the bottom electrode layer 660 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 660 in accordance with embodiments of the invention are not limited to these materials. The thickness of the bottom electrode layer 660 may be, for example, between approximately 10 nm and approximately 100 nm, or between approximately 10 nm and approximately 50 nm, or between approximately 10 nm and approximately 30 nm, or between approximately 25 nm and approximately 40 nm.

Figure 7:
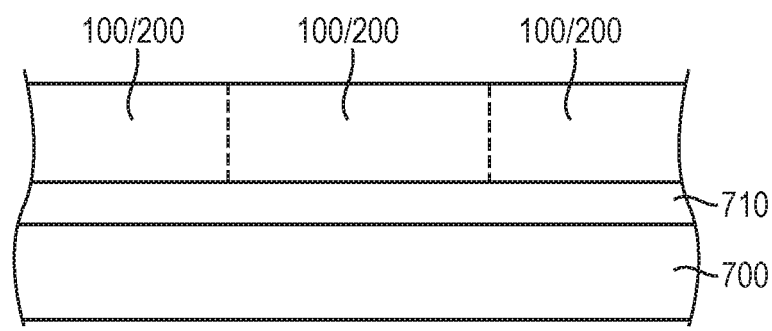
FIG. 7 is a schematic cross-section of unsingulated dies attached to a handle wafer after substrate removal in accordance with various embodiments of the invention.

In embodiments in which multiple unsingulated dies 100 or 200 are etched simultaneously to remove all or a portion of the substrate 105, the etch-revealed surface of the dies 100 or 200 may subsequently be attached to a handle wafer 700, and the submount 300 may be removed for further processing and/or singulation of the dies 100 or 200, as shown in FIG. 7. For example, the dies 100 or 200 may be attached to the handle wafer 700 via a bonding layer 710, which may include, consist essentially of, or consist of, e.g., an adhesive, photoresist (e.g., SU-8), glass frit, an organic material such as benzocyclobutene (BCB), etc. The handle wafer 700 may include, consist essentially of, or consist of any suitably rigid material, e.g., silicon, glass, quartz, or sapphire. After processing of the dies 100 or 200 is completed and each die 100 or 200 is bonded to a submount and/or packaged in a device package, the handle wafer 700 may be removed, resulting in individual devices resembling those depicted in FIG. 6A or FIG. 6D, or additional contacts to the die may be formed, resulting in individual devices resembling those depicted in FIG. 6B or FIG. 6C. Wafer bonding techniques, including reversible ones (i.e., techniques in which the handle wafer is straightforwardly removed after bonding and processing) are known to those of skill in the art and may be accomplished without undue experimentation.

In various embodiments of the invention, the substrate 105 and/or layer 110 may be configured such that the electrochemical etch process removes only a portion thereof. For example, an upper portion (i.e., facing the active structure 115) of substrate 105 may be doped such that the etch process stops when the remainder of the substrate 105 is etched away. Similarly, a doped layer may be embedded within the substrate 105 and/or the layer 110 and utilized as an etch-stop layer to stop the etch process without removing all of the substrate 105 and/or the layer 110.

Figure 8:
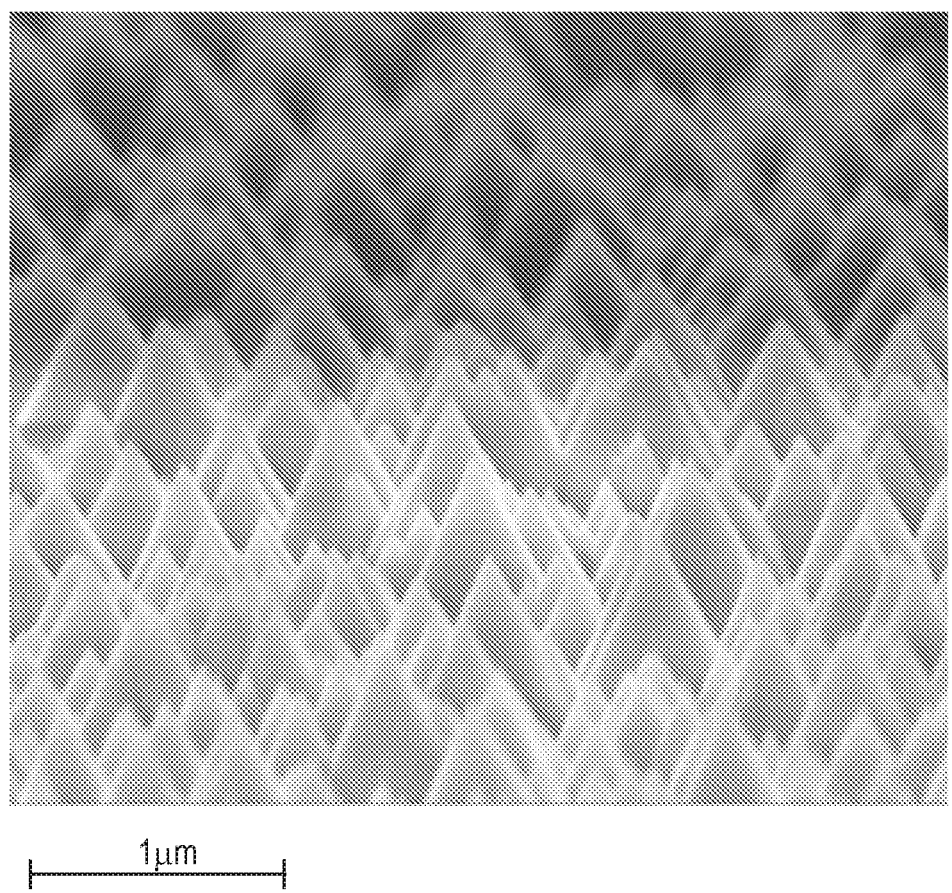
FIG. 8 is a micrograph depicting the surface of a die after substrate removal in accordance with various embodiments of the invention.

In various embodiments, the etching action of the electrolyte 500 itself during the electrochemical removal of the substrate 105 may itself roughen or texture the resulting surface of die 100. For example, FIG. 8 depicts the resulting surface of a die 100 after removal of an AlN substrate 105 utilizing KOH as the electrolyte 500. As shown, the resulting surface of the die 105 features an array or pattern of pyramidal features through which light may be extracted more efficiently compared to a flat planar surface. If such roughness or texture is not desired, then the exposed portion of the die may be smoothed (e.g., by polishing, CMP, etc.) to remove or ameliorate such roughness.

Figure 9A:
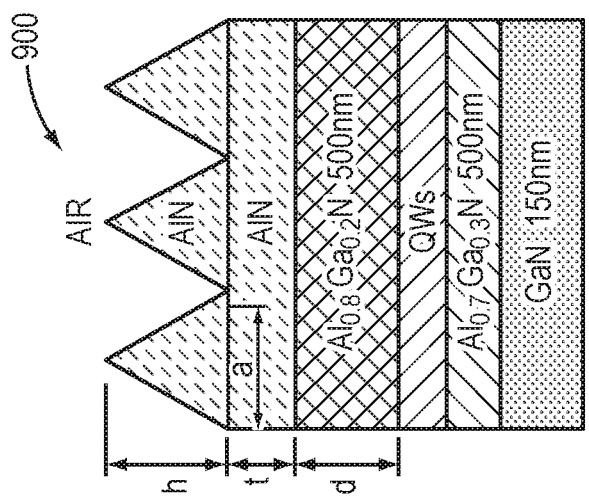
FIGS. 9A-9C are schematic cross-sections of simulated light-emitting devices in accordance with various embodiments of the invention.
Figure 9B:
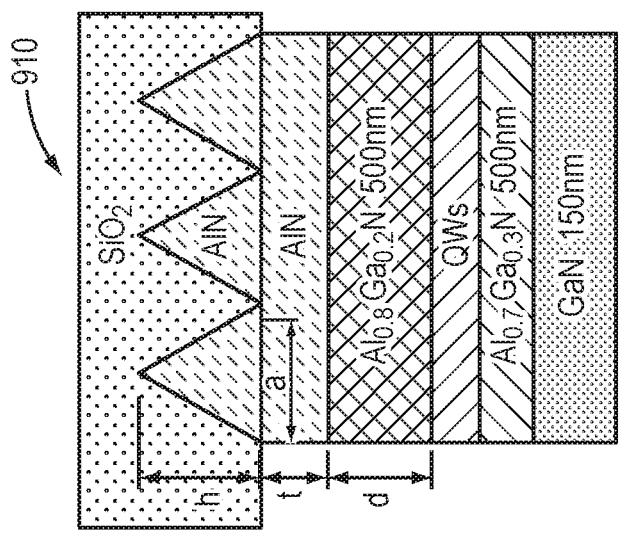
Figure 9C:
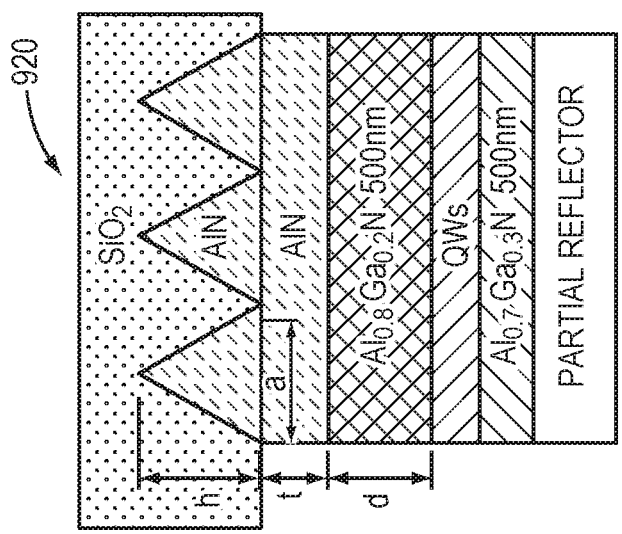

A series of simulations were performed in order to demonstrate the advantageous benefits of embodiments of the present invention—in particular the improvement of photon extraction efficiency enabled via substrate removal. FIG. 9A depicts a device 900 in which the AlN substrate thickness t was set to either 200 µm, 20 µm, or 1 µm (corresponding approximately to complete substrate removal), and the substrate surface has been patterned to form a series of conical structures having a height h of 5 µm and a base width a of 5.5 µm. (In FIGS. 9A-9C, the AlN substrate is depicted as the top of the device, as is the case for devices designed to emit light through the substrate.) Over the AlN substrate is disposed a $Al_{0.8}Ga_{0.2}N$ layer having a thickness d of 500 nm, the active light-emitting quantum wells, a $Al_{0.7}Ga_{0.3}N$ overlayer having a thickness of 100 nm, and a GaN cap layer having a thickness of 150 nm. FIG. 9B depicts a device 910 similar to device 900 but with the addition of a silica encapsulant layer formed over the AlN substrate. FIG. 9C depicts a device 920 similar to device 910 but with the GaN cap layer replaced by a partial reflector layer having a reflectivity to light emitted by the quantum wells of either 20% or 50%. Commercial ray tracing software (ZEMAX, available from Zemax LLC of Kirkland, Wash.) was used to model the extraction efficiency of 265 nm photons generated in the quantum wells. The photons were modeled by assuming that all directions of emission from the quantum well layers were equally likely. The results of the simulations (reported as photon extraction efficiencies) are shown in the table below.

| Substrate Thickness t (μm) | Device 900 | Device 910 | Device 920 20% Reflector | Device 920 50% Reflector |
|---|---|---|---|---|
| 200 | 2.4% | 5.4% | 6.4% | 8.1% |
| 20 | 8.7% | 18.2% | 22.2% | 30.0% |
| 1 | 10.9% | 22.2% | 28.3% | 43.4% |

As shown in the table, combining substrate removal in accordance with embodiments of the present invention with other photon extraction techniques greatly enhances the efficacy of such techniques. For example, simply removing the substrate of device 900 increases the photon extraction efficiency by 4.5 times. On the other hand, removing the substrate with even a partial reflector (for example, the 50% reflector of device 920) increases the photon extraction by over 5 times, and this case exhibits a photon extraction efficiency nearly 20 times larger than that of device 900 prior to substrate removal. In embodiments of the present invention, use of a higher reflectance reflector (e.g., greater than 90%), when combined with substrate removal, may result in photon extraction efficiencies exceeding 80%.

The simulations detailed above were performed with the assumption that the photons generated in the quantum wells are equally likely to be emitted in all directions, as mentioned above. The actual behavior of the photons may diverge from that assumption, particularly as the wavelength of emitted light decreases. Thus, the actual benefits of substrate removal may be expected to exceed those demonstrated in the simple simulations provided herein. In addition, the simulations are designed to demonstrate relative benefits of various techniques described herein, rather than demonstrating the maximum possible impact and ultimate device performance afforded by techniques such as substrate removal.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming an illumination device, the method comprising:
   providing a plurality of device dies each comprising (i) an aluminum nitride substrate, (ii) an active light-emitting structure disposed over the substrate, and (iii) a doped bottom contact layer (a) disposed between the substrate and the active structure and (b) comprising n-type AlGaN doped at a dopant concentration no less than $10^{19}$ cm$^{-3}$ and having a Ga concentration of at least 20%;
   attaching the plurality of device dies to a submount;
   contacting the plurality of device dies with an electrolyte;
   during contact of the plurality of device dies with the electrolyte, applying an electrical potential to the plurality of device dies, whereby the electrolyte etches away the aluminum nitride substrate of each device die to reveal the doped bottom contact layer thereof, the doped bottom contact layer remaining substantially unetched by the electrolyte;
   dividing the submount into a plurality of submount portions each having a device die attached thereto; and
   packaging one of the submount portions, and the device die attached thereto, in a device package, thereby forming an illumination device.

2. The method of claim 1, wherein packaging the submount portion and the device die attached thereto comprises at least one of (i) electrically connecting the submount portion to the device package, (ii) disposing over the device die a rigid lens for receiving light from the device die, or (iii) texturing and/or coating a surface of the doped bottom contact layer of the device die.

3. The method of claim 1, wherein the submount comprises a ceramic material.

4. The method of claim 1, wherein the submount comprises polycrystalline aluminum nitride.

5. The method of claim 1, wherein the substrate of each of the device dies is single-crystalline.

6. The method of claim 1, wherein the active structure of each of the device dies comprises a multiple quantum well layer.

7. The method of claim 1, wherein (i) the electrical potential is negative and (ii) the electrolyte is basic.

8. The method of claim 1, wherein (i) the electrical potential is positive and (ii) the electrolyte is acidic.

9. The method of claim 1, wherein the electrolyte comprises at least one of potassium hydroxide or sodium hydroxide.

10. The method of claim 1, wherein the electrolyte comprises nitric acid.

11. The method of claim 1, wherein contacting the plurality of device dies with the electrolyte comprises immersing the plurality of device dies in the electrolyte.

12. A method of forming an illumination device, the method comprising:
    providing a plurality of device dies each comprising (i) an aluminum nitride substrate, (ii) an active light-emitting structure disposed over the substrate, and (iii) a doped bottom contact layer disposed between the substrate and the active structure;
    attaching the plurality of device dies to a submount;
    contacting the plurality of device dies with an electrolyte;
    during contact of the plurality of device dies with the electrolyte, applying an electrical potential to the plurality of device dies, whereby the electrolyte etches away the aluminum nitride substrate of each device die to reveal the doped bottom contact layer thereof, the doped bottom contact layer remaining substantially unetched by the electrolyte;
    dividing the submount into a plurality of submount portions each having a device die attached thereto; and
    packaging one of the submount portions, and the device die attached thereto, in a device package, thereby forming an illumination device,
    wherein contacting the plurality of device dies with the electrolyte comprises immersing the plurality of device dies in the electrolyte, at least a portion of the submount being immersed in the electrolyte during immersion of the plurality of device dies.

13. The method of claim 12, wherein the doped bottom contact layer of each of the device dies is n-type doped.

14. The method of claim 12, wherein the doped bottom contact layer of each of the device dies is not composed of aluminum nitride.

15. The method of claim 12, wherein the doped bottom contact layer of each of the device dies comprises n-type AlGaN.

16. The method of claim 15, wherein the doped bottom contact layer of each of the device dies is doped at a dopant concentration no less than $10^{19}$ cm$^{-3}$, and the doped bottom contact layer of each of the device dies has a Ga concentration of at least 20%.

17. The method of claim 12, wherein packaging the submount portion and the device die attached thereto comprises at least one of (i) electrically connecting the submount portion to the device package, (ii) disposing over the device die a rigid lens for receiving light from the device die, or (iii) texturing and/or coating a surface of the doped bottom contact layer of the device die.

18. The method of claim 12, wherein the submount comprises a ceramic material.

19. The method of claim 12, wherein the submount comprises polycrystalline aluminum nitride.

20. The method of claim 12, wherein the substrate of each of the device dies is single-crystalline.

21. The method of claim 12, wherein the active structure of each of the device dies comprises a multiple quantum well layer.

22. The method of claim 12, wherein (i) the electrical potential is negative and (ii) the electrolyte is basic.

23. The method of claim 12, wherein (i) the electrical potential is positive and (ii) the electrolyte is acidic.

24. The method of claim 12, wherein the electrolyte comprises at least one of potassium hydroxide or sodium hydroxide.

25. The method of claim 12, wherein the electrolyte comprises nitric acid.

26. A method of forming an illumination device, the method comprising:
    providing a plurality of device dies each comprising (i) an aluminum nitride substrate, (ii) an active light-emitting structure disposed over the substrate, and (iii) a doped bottom contact layer disposed between the substrate and the active structure;
    attaching the plurality of device dies to a submount;
    contacting the plurality of device dies with an electrolyte;
    during contact of the plurality of device dies with the electrolyte, applying an electrical potential to the plurality of device dies, whereby the electrolyte etches away the aluminum nitride substrate of each device die to reveal the doped bottom contact layer thereof, the doped bottom contact layer remaining substantially unetched by the electrolyte;
    dividing the submount into a plurality of submount portions each having a device die attached thereto; and
    packaging one of the submount portions, and the device die attached thereto, in a device package, thereby forming an illumination device,
    wherein the submount does not contact the electrolyte while the plurality of device dies are contacting the electrolyte.

27. The method of claim 26, wherein packaging the submount portion and the device die attached thereto comprises at least one of (i) electrically connecting the submount portion to the device package, (ii) disposing over the device die a rigid lens for receiving light from the device die, or (iii) texturing and/or coating a surface of the doped bottom contact layer of the device die.

28. The method of claim 26, wherein the submount comprises a ceramic material.

29. The method of claim 26, wherein the submount comprises polycrystalline aluminum nitride.

30. The method of claim 26, wherein the substrate of each of the device dies is single-crystalline.

31. The method of claim 26, wherein the active structure of each of the device dies comprises a multiple quantum well layer.

32. The method of claim 26, wherein (i) the electrical potential is negative and (ii) the electrolyte is basic.

33. The method of claim 26, wherein (i) the electrical potential is positive and (ii) the electrolyte is acidic.

34. The method of claim 26, wherein the electrolyte comprises at least one of potassium hydroxide or sodium hydroxide.

35. The method of claim 26, wherein the electrolyte comprises nitric acid.

36. The method of claim 26, wherein the doped bottom contact layer of each of the device dies is n-type doped.

37. The method of claim 26, wherein contacting the plurality of device dies with the electrolyte comprises immersing the plurality of device dies in the electrolyte.

38. The method of claim 26, wherein the doped bottom contact layer of each of the device dies is not composed of aluminum nitride.

39. The method of claim 26, wherein the doped bottom contact layer of each of the device dies comprises n-type AlGaN.

40. The method of claim 39, wherein the doped bottom contact layer of each of the device dies is doped at a dopant concentration no less than $10^{19}$ cm$^{-3}$, and the doped bottom contact layer of each of the device dies has a Ga concentration of at least 20%.

* * * * *